(12) United States Patent
Oh et al.

(10) Patent No.: US 9,274,360 B2
(45) Date of Patent: Mar. 1, 2016

(54) CUSHION SHEET AND DISPLAY DEVICE HAVING THE SAME

(75) Inventors: Jeong Seok Oh, Yongin (KR); Yun Ho Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 530 days.

(21) Appl. No.: 13/593,766

(22) Filed: Aug. 24, 2012

(65) Prior Publication Data
US 2013/0135877 A1  May 30, 2013

(30) Foreign Application Priority Data

Nov. 30, 2011  (KR) .................. 10-2011-0127180

(51) Int. Cl.
| G06F 1/16 | (2006.01) |
| C09J 7/02 | (2006.01) |
| B32B 3/24 | (2006.01) |
| B32B 7/12 | (2006.01) |
| G02F 1/1333 | (2006.01) |

(Continued)

(52) U.S. Cl.
CPC .......... *G02F 1/133308* (2013.01); *B32B 3/266* (2013.01); *G06F 1/1601* (2013.01); *G06F 1/1637* (2013.01); *H04M 1/0266* (2013.01); *B32B 7/12* (2013.01); *B32B 2457/20* (2013.01); *C09J 7/02* (2013.01); *C09J 2201/122* (2013.01); *C09J 2201/20* (2013.01); *G02F 1/1336* (2013.01); *G02F 2001/133314* (2013.01); *G02F 2201/50* (2013.01); *G02F 2201/503* (2013.01); *G02F 2202/28* (2013.01); *G06F 1/1626* (2013.01); *G06F 2200/1612* (2013.01); *H01L 51/52* (2013.01); *H04M 1/185* (2013.01); *Y10T 428/24273* (2015.01); *Y10T 428/24298* (2015.01); *Y10T 428/24314* (2015.01); *Y10T 428/24322* (2015.01); *Y10T 428/24331* (2015.01); *Y10T 428/28* (2015.01)

(58) Field of Classification Search
None
See application file for complete search history.

(56) References Cited

U.S. PATENT DOCUMENTS

| 5,666,261 A | 9/1997 | Aguilera |
| 6,311,399 B1 | 11/2001 | Steelman et al. |

(Continued)

FOREIGN PATENT DOCUMENTS

| CN | 1892337 A | 1/2007 |
| EP | 0 600 279 A2 | 11/1993 |

(Continued)

OTHER PUBLICATIONS

Machine Translation of JP 2001279195 A, Oct. 2001.*

*Primary Examiner* — Jeff Vonch
(74) *Attorney, Agent, or Firm* — Lee & Morse, P.C.

(57) ABSTRACT

A cushion sheet including a cushion film defining a first surface of the cushion sheet; and an adhesive layer on a surface of the cushion film and defining a second surface of the cushion sheet, the cushion film and adhesive layer including a plurality of bubble discharge members inclined with respect to the first and second surfaces and openings extending through the cushion film and the adhesive layer for removing bubbles generated at adhesion, the openings having a first end in the adhesive layer and a second end in the cushion film; and each of the bubble discharge members are inclined at a penetrating angle within the cushion sheet between a respective one of the bubble discharge members and a line perpendicular to a plane of the cushion sheet, the line extending from the first end of the bubble discharge member to the first surface of the cushion sheet.

8 Claims, 4 Drawing Sheets

US 9,274,360 B2
Page 2

(51) Int. Cl.
*B32B 3/26* (2006.01)
*H04M 1/02* (2006.01)
*H01L 51/52* (2006.01)
*G02F 1/1335* (2006.01)
*H04M 1/18* (2006.01)

(56) References Cited

U.S. PATENT DOCUMENTS

| | | | |
|---|---|---|---|
| 6,615,951 B1 * | 9/2003 | Boutin et al. | 181/293 |
| 2006/0110608 A1 | 5/2006 | Azumi et al. | |
| 2006/0152648 A1 * | 7/2006 | Kim | G02F 1/133308 349/58 |
| 2006/0285043 A1 | 12/2006 | Kim et al. | |
| 2007/0121021 A1 * | 5/2007 | Kaehler et al. | 349/12 |
| 2007/0166510 A1 * | 7/2007 | Kato et al. | 428/137 |
| 2008/0220184 A1 * | 9/2008 | Sakurai | G02F 1/133308 428/1.51 |
| 2009/0009947 A1 | 1/2009 | Lam et al. | |
| 2009/0195973 A1 | 8/2009 | Yee et al. | |
| 2009/0261718 A1 * | 10/2009 | Ha et al. | 313/504 |
| 2009/0279313 A1 * | 11/2009 | Teragawa | 362/355 |
| 2010/0142055 A1 * | 6/2010 | Murayama et al. | 359/599 |
| 2010/0142172 A1 * | 6/2010 | Moon et al. | 361/809 |
| 2011/0241540 A1 * | 10/2011 | Kim | H05B 33/22 313/504 |
| 2012/0170244 A1 * | 7/2012 | Kwon | G06F 1/1637 361/829 |
| 2012/0218494 A1 * | 8/2012 | Nakayama et al. | 349/60 |
| 2012/0222805 A1 * | 9/2012 | Shintani | C09J 7/0289 156/240 |
| 2012/0262660 A1 | 10/2012 | Fujiwara et al. | |
| 2014/0145167 A1 * | 5/2014 | Son | H01L 51/0097 257/40 |

FOREIGN PATENT DOCUMENTS

| | | | | |
|---|---|---|---|---|
| EP | 0 600 279 A2 | | 6/1994 | |
| EP | 1633176 A1 | | 3/2006 | |
| EP | 2086008 A1 | | 8/2009 | |
| JP | 2001279195 A | * | 10/2001 | C09J 5/00 |
| JP | 2003232904 A | | 8/2003 | |
| JP | 2009098324 A | * | 5/2009 | |
| JP | 2009244690 A | * | 10/2009 | |
| JP | 2009282133 A | * | 12/2009 | |
| JP | 2010175680 A | * | 8/2010 | |
| JP | 2011090891 A | * | 5/2011 | |
| KR | 20-0161481 | | 8/1999 | |
| KR | 10-2006-0053264 A | | 5/2006 | |
| KR | 2011-0043875 A | | 4/2011 | |
| WO | WO 2011/125307 A1 | | 10/2011 | |

* cited by examiner

_US 9,274,360 B2_

CUSHION SHEET AND DISPLAY DEVICE HAVING THE SAME

CROSS-REFERENCE TO RELATED APPLICATIONS

A claim for priority under 35 U.S.C §119 is made to Korean Patent Application No. 10-2011-0127180 filed Nov. 30, 2011, the entirety of which is incorporated by reference herein.

BACKGROUND

1. Field

The inventive concepts described herein relate to a cushion sheet and a display device including the same.

2. Description of the Related Art

A mobile device generally includes a housing and a display panel for displaying images disposed within the housing. A cushion sheet is disposed between the display panel and the housing. The cushion sheet is generally rectangular and flat.

SUMMARY

One or more embodiments may provide a cushion sheet including: a cushion film, the cushion film defining a first surface of the cushion sheet; and an adhesive layer deposited on at least one surface of the cushion film, the adhesive layer defining a second surface of the cushion sheet, wherein: the cushion film and the adhesive layer include a plurality of bubble discharge members inclined with respect to the first and second surfaces, the plurality of bubble discharge members including openings extending through the cushion film and the adhesive layer for removing air bubbles generated at adhesion, the openings having a first end in the adhesive layer and a second end in the cushion film; and each of the plurality of bubble discharge members are inclined at a penetrating angle within the cushion sheet, the penetrating angle being an angle formed between a respective one of the bubble discharge members and a line perpendicular to a plane of the cushion sheet, the line extending from the first end of the respective bubble discharge member to the first surface of the cushion sheet. Each of the plurality of bubble discharge members may include a rectangular slit extending through the cushion film and the adhesive layer.

The penetrating angle of each slit may be represented by a and may satisfy the following equation, $$\tan \alpha \geq W/T, \qquad (1)$$

wherein W indicates a width of the slit and T indicates a sum of thicknesses of the cushion film and the adhesive layer.

Each of the plurality of bubble discharge members may include a circular through-hole extending through the cushion film and the adhesive layer. The penetrating angle of each through-hole may be represented by β and may satisfy the following equation, $$\tan \beta \geq D/T, \qquad (2)$$

wherein D indicates a diameter of the through-hole and T indicates a sum of thicknesses of the cushion film and the adhesive layer. The penetrating angle may be more than 30 degrees.

One or more embodiments may provide a cushion sheet including: a cushion film, the cushion film defining a first surface of the cushion sheet; and an adhesive layer deposited on one surface of the cushion film, the adhesive layer defining a second surface of the cushion sheet, wherein a plurality of bubble discharge members extend through the cushion film and the adhesive layer and are inclined with respect to the first and second surfaces, the plurality of bubble discharge members including openings for removing air bubbles generated at adhesion, the openings having a first end in the adhesive layer and a second end in the cushion film, and wherein the first end and the second end of each of the openings are not overlapping. The first end and the second end of each of the openings may be disposed diagonally relative to each other.

One or more embodiments may provide a display device, including: a display panel displaying an image; a housing receiving the display panel; a window member disposed on a side of the display device from which light of the display panel is output; and a cushion sheet disposed between the display panel and the housing, a first surface of the cushion sheet being adjacent to the display panel and a second opposing surface of the cushion sheet being adjacent to the housing, each of the plurality of bubble discharge members including openings extending through the cushion sheet between the opposing first and second surfaces of the cushion sheet, a first end of the openings corresponding in position to the second surface and a second end of the openings corresponding in position to the first surface, wherein each of the plurality of bubble discharge members are disposed at a penetrating angle within the cushion sheet, the penetrating angle being an angle formed between a respective one of the bubble discharge members and a line perpendicular to the cushion sheet, the line extending from the first end of the bubble discharge member to the first surface of the cushion sheet.

The cushion sheet may include a cushion film; and an adhesive layer deposited on at least one surface of the cushion film, wherein the bubble discharge members extend through the cushion film and the adhesive layer. Each of the bubble discharge members may include a rectangular slit extending through the cushion sheet, and the penetrating angle of each slit may be represented by α and may satisfy the following equation, $$\tan \alpha \geq W/T, \qquad (1)$$

wherein W indicates a width of the slit and T indicates a thickness of the cushion sheet.

The plurality of bubble discharge members may include a circular through-hole extending through the cushion sheet and a penetrating angle of each through-hole may be represented by β and may satisfy the following equation, $$\tan \beta \geq D/T, \qquad (2)$$

wherein D indicates a diameter of the through-hole and T indicates a thickness of the cushion sheet. The penetrating angle may be more than 30 degrees.

One or more embodiments may provide display device, including: display panel for displaying an image; a housing receiving the display panel; a window member on a side of the display panel from which light of the display panel is output; and a cushion sheet between the display panel and the housing, the cushion sheet including opposing first and second surfaces, and a plurality of bubble discharge members inclined with respect to the first and second surfaces, the plurality of bubble discharge members including openings extending through the cushion sheet between opposing first and second surfaces of the cushion sheet, a first end of the openings corresponding in position to the second surface and a second end of the openings corresponding in position to the first surface, wherein the first and second end of each of the openings are not overlapping. The first end and the second end of each of the openings may be disposed diagonally relative to each other.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
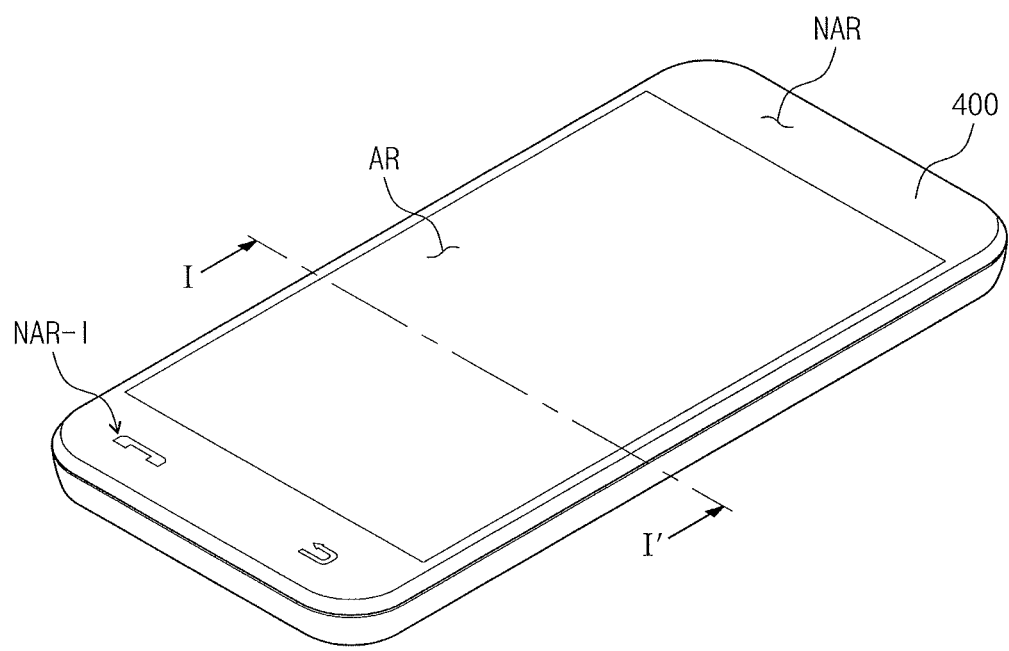
FIG. 1 illustrates a perspective view of a display device according to an embodiment.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
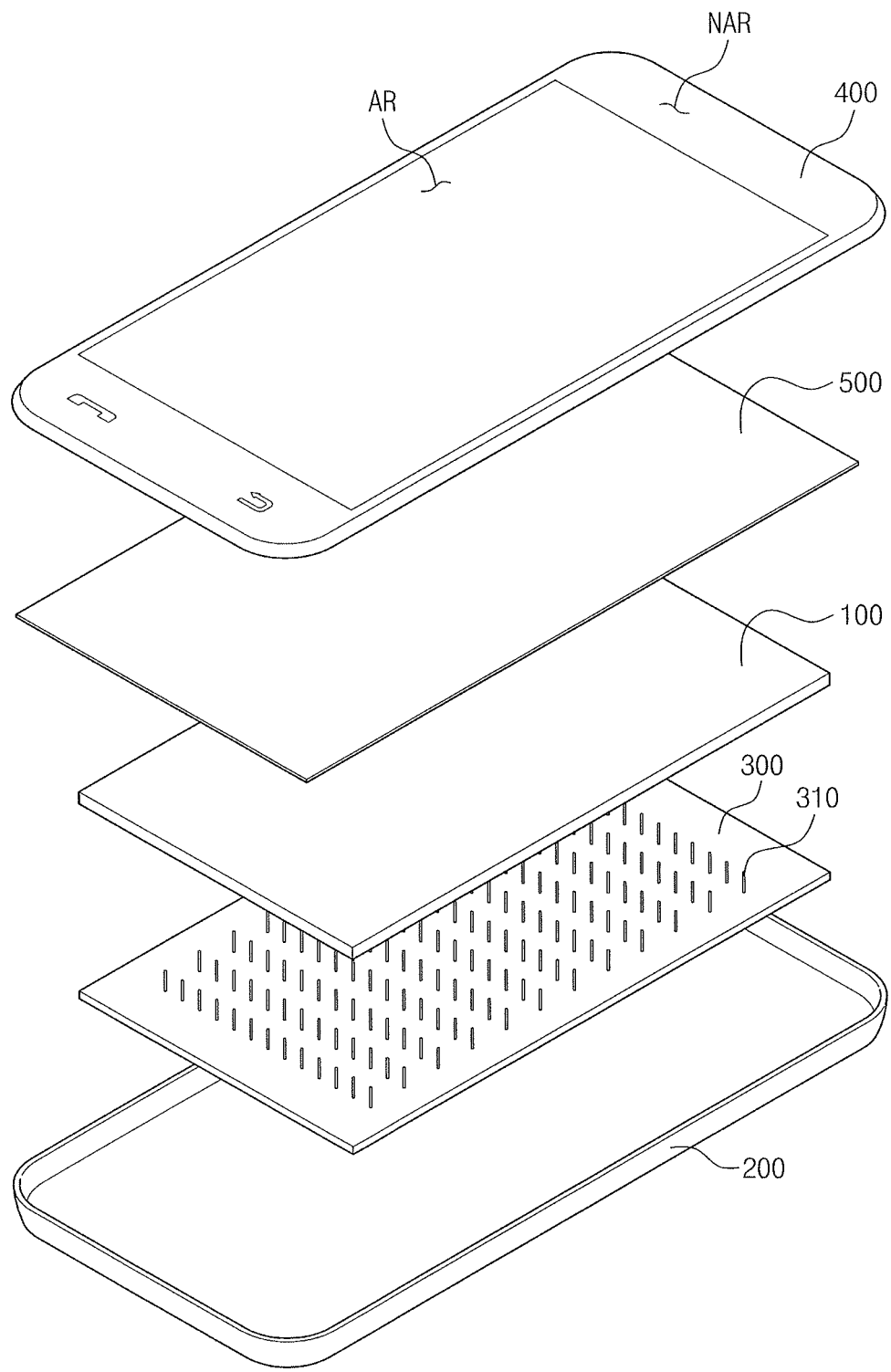
FIG. 2 illustrates an exploded perspective view of the display device in FIG. 1.
Figure 3:
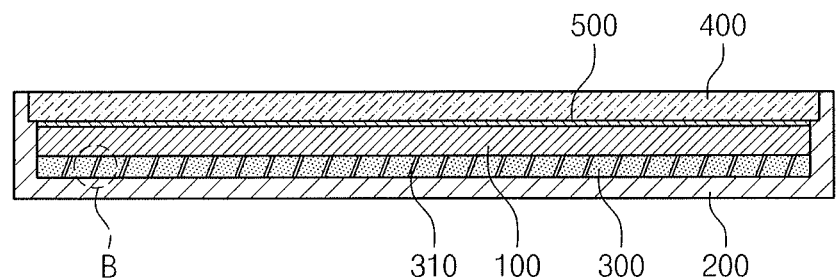
FIG. 3 illustrates a cross-sectional view taken along a line I-I' in FIG. 1.
Figure 4:
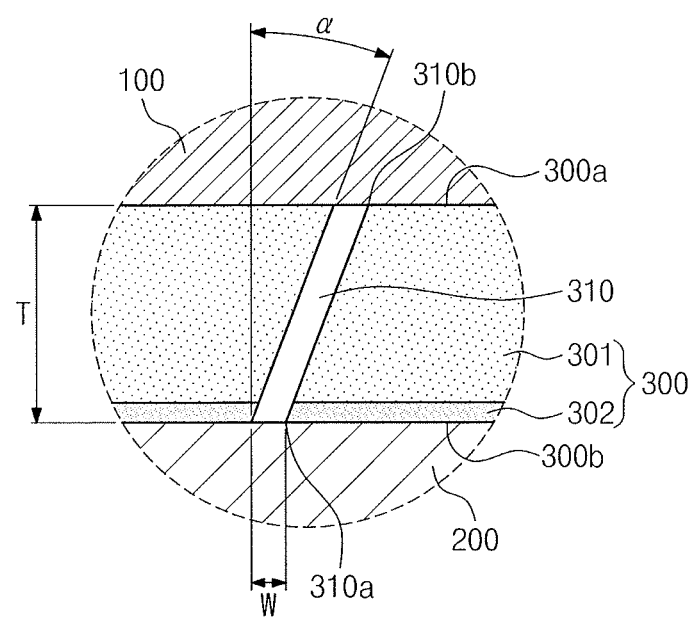
FIG. 4 illustrates an enlarged view of a region A in FIG. 3.

FIG. 1 illustrates a perspective view of a display device according to an embodiment. FIG. 2 illustrates an exploded perspective view of the display device in FIG. 1. FIG. 3 illustrates a cross-sectional view taken along a line I-I' in FIG. 1. FIG. 4 illustrates an enlarged view of a region A in FIG. 3.

Referring to FIGS. 1 through 4, a display device according to an embodiment of the inventive concept includes a display panel 100, housing 200 for receiving the display panel 100, a window member 400 disposed over the display panel 100, and a cushion sheet 300 disposed between the display panel 100 and the housing 200.

The display panel 100 displays images. The display panel 100 is not limited to a specific case. For example, the display panel 100 may include self light-emitting display panels such as an Organic Light Emitting Display (OLED) panel, a Plasma Display Panel (PDP), and the like. Further, the display panel 100 may include non-emissive display panels such as a Liquid Crystal Display (LCD) panel, an ElectroPhoretic Display (EPD) panel, an ElectroWetting Display (EWD) panel, and the like. If a non-emissive display panel is used as the display panel 100, a display device may include a back-light unit that supplies light to the display panel 100.

The housing 200 receives the display panel 100. FIG. 1 illustrates an example embodiment of the housing 200, which includes a single member having a space or cavity for receiving the display panel 100 therein. However, the housing 200 can be formed of two coupled members (not shown), which together form the space or cavity. In an example embodiment, the housing 200, formed of one member, will be described.

The housing 200 may further receive a printed circuit board, on which a plurality of active elements (not shown) and/or a plurality of passive elements (not shown) are mounted. The housing 200 can further receive a power supply unit (not shown) suitable for display devices.

The cushion sheet 300 is disposed between the display panel 100 and the housing 200, and is capable of absorbing an external shock sustained by the display panel 100. The cushion sheet 300 prevents the external shock from being directly applied to the display panel 100. For example, the cushion sheet 300 may mitigate the impact of the external shock on the display panel 100.

The cushion sheet 300 includes a cushion film 301 capable of absorbing an external shock and an adhesive layer 302 deposited on one or both of first and second opposing surfaces of the cushion film 301. For example, the adhesive layer 302 may be deposited on the first surface of the cushion film 301, e.g., adjacent the display panel 100, to secure the cushion sheet 300 to the display panel 100. In addition or alternatively, the adhesive layer 302 may be deposited on the second surface of the cushion film 301, e.g., adjacent the housing 200, to secure the cushion sheet 300 to the housing 200. The cushion film 301 may define a first surface 300a of the cushion sheet 300. The adhesive layer 302 may define a second, opposing surface 300b of the cushion sheet 300. The cushion film 301 may include a foam or a foam-stacked structure, and may have a thickness of about 300 μm.

The cushion sheet 300 includes a plurality of bubble discharge members 310. The bubble discharge members 310 may include openings extending through the cushion sheet 300, e.g., through the cushion film 301 and the adhesive layer 302, to permit removal of air bubbles generated when the cushion sheet 300 is adhered to the display panel 100 or the housing 200. For example, the air bubbles may pass through the bubble discharge members 310. Each of the bubble discharge members 310 may include a first end 310a and a second end 310b. The first end 310a may be in the adhesive layer 302 and the second end 310b may be in the cushion film 301. Each of the bubble discharge members 310 may include a slit, e.g., a rectangular opening, formed by cutting through portions of the cushion sheet 300.

Each of the bubble discharge members 310 may be disposed at a penetrating angle α within the cushion sheet 300 and may be inclined with respect to a thickness direction, i.e., thickness, of the cushion sheet 300. According to an implementation, each of the bubble discharge members 310 may be inclined with respect to a plane of the first and second surfaces 300a and 330b of the cushion sheet 300. The penetrating angle α may be an angle formed between one of the bubble discharge members 310 and a line that is perpendicular to a plane of the cushion sheet 300 and extends from the first end 310a of the bubble discharge member 310 to the first surface 300a of the cushion sheet 300. The penetrating angle α of each of the bubble discharge members 310 may be more than 30 degrees.

The penetrating angle of each of the bubble discharge members 310 satisfies the following equation.

$$\tan \alpha \geq W/T, \quad (1)$$

In the equation, W indicates a width of the slit, and T indicates a thickness of the cushion sheet 300. For example, T includes a thickness of the cushion film 301 and a thickness of the adhesive layer 302.

According to an implementation, the first end 310a of each of the bubble discharge members 310 is in a position that is different, e.g., not in alignment with, the second end 310b. For example, the first end 310a and the second end 310b may not be vertically aligned. According to some embodiments, the first end 310a and the second end 310b are not disposed in an overlapping fashion with respect to each other. According to some embodiments, the first end 310a and the second end 310b may be disposed diagonally with respect to each other. Thus, it is possible to prevent the bubble discharge members 310 from being seen by a user of the display device.

According to the embodiments, the window member 400 is disposed on a side of the display device from which images are output from the display panel 100. The window member 400 is coupled with the housing 200 to form an outer surface of the display device with the housing 200.

The window member 400 includes a display region AR in which images generated from the display panel 100 are displayed, and a non-display region NAR adjacent to at least a part of the display region AR.

The non-display region NAR does not display images. At least a part of the non-display region NAR may include an input icon region NAR-I. The input icon region NAR-I may be activated when the display device operates in a specific mode.

The display device, according to an embodiment, may further include an adhesive sheet 500, which is disposed between the display panel 100 and the window member 500. The adhesive sheet 500 is used to attach the window member 400 to the display panel 100. The adhesive sheet 500 may be transparent to prevent lowering of a luminance of an image output from the display panel 100.

As described above, the display device, according to an embodiment, includes the bubble discharge member 310, which has a penetrating angle α and is inclined with respect to a thickness direction of the cushion sheet 300. Thus, the bubble discharge member 310 may not be seen by a user of the display device.

Figure 5:
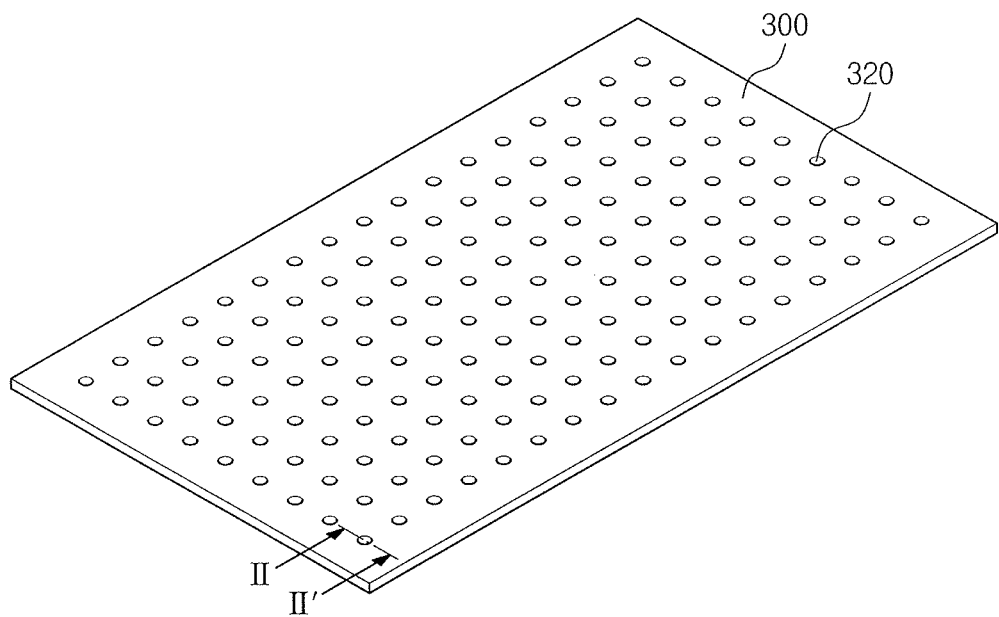
FIG. 5 illustrates a perspective view of a cushion sheet capable of being applied to a display device according to another embodiment.
Figure 6:
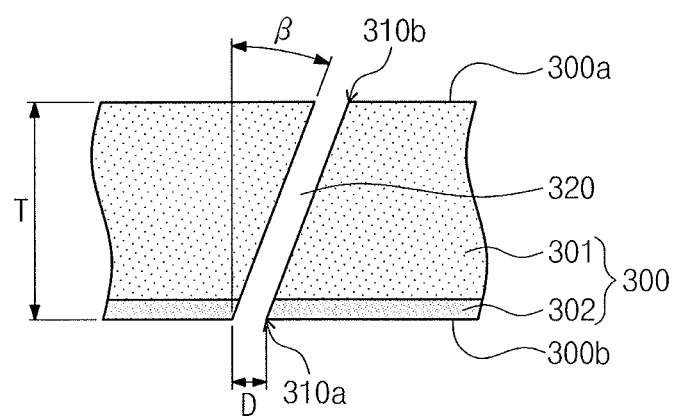
FIG. 6 illustrates a cross-sectional view taken along a line II-II' of FIG. 5.

Below, another embodiment will be described with reference to FIGS. 5 and 6. In FIGS. 5 and 6, elements that are identical to elements illustrated in FIGS. 1 through 4 are identified by the same reference numerals, and a description thereof is omitted. Only differences between the embodiments shown in FIGS. 1 through 4 and the embodiments shown in FIGS. 5 and 6 will be discussed.

FIG. 5 illustrates a perspective view of a cushion sheet that may be applied to a display device, according to another embodiment. FIG. 6 illustrates a cross-sectional view taken along a line II-II' in FIG. 5.

Referring to FIGS. 5 and 6, according to an embodiment, the cushion sheet 300 of the display device includes bubble discharge members 320. The bubble discharge members 320 may be circular through-holes extending through the cushion sheet 300, e.g., through the cushion film 301 and the adhesive layer 302. Each of the bubble discharge members 320 may include a first end 320a and a second end 320b. The first end 320a may be in the adhesive layer 302 and the second end 320b may be in the cushion film 301.

Each of the bubble discharge members 320 may be disposed at a penetrating angle β within the cushion sheet 300 and may be inclined with respect to a thickness direction, i.e., thickness, of the cushion sheet 300. Each of the bubble discharge members 320 may be inclined with respect to the planes of the first and second surfaces 300a and 330b. The penetrating angle β may be an angle formed between one of the bubble discharge members 320 and a line that is perpendicular to the cushion sheet 300 and extends from the first end 320a of the bubble discharge member 310 to the first surface 300a of the cushion sheet 300. The penetrating angle β of each of the bubble discharge members 320 may desirably be more than 30 degrees.

The penetrating angle β of each of the bubble discharge members 320 satisfies the following equation.

$$\tan \beta \geq D/T, \quad (2)$$

In the equation, D indicates a diameter of a through hole, and T is a thickness of the cushion sheet 300.

As described above, the bubble discharge members 320 are not seen by a user of the display device.

By way of summation and review, air bubbles can be generated in the housing of a general mobile device when the cushion sheet is attached to the housing. For this reason, the cushion sheet has a slit for removing air bubbles. However, the slit can be seen by a user in use of the mobile device.

In contrast, according to the embodiments, a cushion sheet includes a bubble discharge member formed to penetrate the cushion sheet and used to prevent generation of air bubbles at adhesion. The bubble discharge member has a penetrating angle inclined with respect to a thickness direction of the cushion sheet. Thus, in a display device having the cushion sheet, according to the embodiments, it is possible to prevent the bubble discharge member from being seen by a user.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A cushion sheet, comprising:
a cushion film, the cushion film defining a first surface of the cushion sheet; and
an adhesive layer deposited on at least one surface of the cushion film, the adhesive layer defining a second surface of the cushion sheet,
wherein:
the cushion film and the adhesive layer include a plurality of bubble discharge members inclined with respect to the first and second surfaces, the plurality of bubble discharge members being openings extending through the cushion film and the adhesive layer for removing air bubbles generated at adhesion, the bubble discharge members having a first end in the adhesive layer and a second end in the cushion film;
each of the plurality of bubble discharge members are inclined at a penetrating angle within the cushion sheet, the penetrating angle being an angle formed between a respective one of the bubble discharge members and a line perpendicular to a plane of the cushion sheet, the line extending from the first end of the respective bubble discharge members to the first surface of the cushion sheet such that the first end of each of the bubble discharge members at the second surface of the cushion sheet does not overlap with the corresponding second end of each of the bubble discharge members at the first surface of the cushion sheet;
the bubble discharge members extend linearly from the first surface of the cushion sheet to the second surface of the cushion sheet through the cushion film and the adhesive layer; and wherein either:
each of the plurality of bubble discharge members is a rectangular slit extending through the cushion film and the adhesive layer and the penetrating angle of each slit is represented by α and satisfies the following equation, $$\tan \alpha \geq W/T, \tag{1}$$

wherein W indicates the width of the slit and T indicates the sum of the thicknesses of the cushion film and the adhesive layer,
or
each of the plurality of bubble discharge members is a circular though-hole extending through the cushion film and the adhesive layer and the penetrating angle of each slit is represented by β and satisfies the following equation, $$\tan \beta \geq D/T, \tag{2}$$

wherein D indicates the diameter of the through-hole and T indicates the sum of the thicknesses of the cushion film and the adhesive layer.

2. The cushion sheet of claim 1, wherein the penetrating angle is more than 30 degrees.

3. A display device, comprising:
a display panel displaying an image;
a housing receiving the display panel;
a window member disposed on a side of the display device from which light of the display panel is output; and
a cushion sheet display between the display panel and the housing, a first surface of the cushion sheet being adjacent to the display panel and a second surface of the cushion sheet being adjacent to the housing, each of a plurality of bubble discharge members being openings extending through the cushion sheet between the opposing first and second surfaces of the cushion sheet for removing air bubbles generated at adhesion, a first end of the bubble discharge members corresponding in position to the second surface and a second end of the bubble discharge members corresponding in position to the first surface,
wherein:
each of the plurality of bubble discharge members are inclined at a penetrating angle within the cushion sheet, the penetrating angle formed between a respective one of the bubble discharge members and a line perpendicular to a plane of the cushion sheet, the line extending from the first end of one of the bubble discharge member to the first surface of the cushion sheet such that the first end of each of the bubble discharge members at the second surface of the cushion sheet does not overlap with the corresponding second end of each of the bubble discharge members at the first surface of the cushion sheet,
the cushion sheet includes:
a cushion film; and
an adhesive layer deposited on at least one surface of the cushion film, and
the bubble discharge members extend linearly from the first surface of the cushion sheet to the second surface of the cushion sheet through the cushion film and the adhesive layer.

4. The display device of claim 3, wherein each of the bubble discharge members includes a rectangular slit extending through the cushion sheet, and the penetrating angle of each slit is represented by α and satisfies the following equation, $$\tan \alpha \geq W/T, \tag{1}$$

wherein W indicates a width of the slit and T indicates a thickness of the cushion sheet.

5. The display device of claim 3, wherein the plurality of bubble discharge members includes a circular through-hole extending through the cushion sheet and a penetrating angle of each through-hole is represented by β and satisfies the following equation, $$\tan \beta \geq D/T, \tag{2}$$

wherein D indicates a diameter of the through-hole and T indicates a thickness of the cushion sheet.

6. The display device of claim 3, wherein the penetrating angle is more than 30 degrees.

7. The display device of claim 3, wherein the bubble discharge members form air paths for air bubbles to pass therethrough.

8. The display device of claim 3, wherein the bubble discharge members are not observable from a position along the line perpendicular to the plane of the cushion sheet.

* * * * *